(12) United States Patent
Ko et al.

(10) Patent No.: US 9,269,414 B2
(45) Date of Patent: Feb. 23, 2016

(54) SEMICONDUCTOR INTEGRATED CIRCUIT

(71) Applicant: SK hynix Inc., Gyeonggi-do (KR)

(72) Inventors: Jae-Bum Ko, Gyeonggi-do (KR);
Sang-Jin Byeon, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 179 days.

(21) Appl. No.: 14/106,813

(22) Filed: Dec. 15, 2013

(65) Prior Publication Data

US 2015/0098293 A1    Apr. 9, 2015

(30) Foreign Application Priority Data

Oct. 4, 2013    (KR) .......................... 10-2013-0118596

(51) Int. Cl.
*G11C 8/00* (2006.01)
*G11C 8/12* (2006.01)

(52) U.S. Cl.
CPC ........................................ *G11C 8/12* (2013.01)

(58) Field of Classification Search
USPC ...................................................... 365/230.01
See application file for complete search history.

(56) References Cited

U.S. PATENT DOCUMENTS

| | | | | |
|---|---|---|---|---|
| 6,426,560 B1 * | 7/2002 | Kawamura | ............... | G11C 5/02 257/735 |
| 7,227,251 B2 * | 6/2007 | Sakuma | ............... | H01L 23/4951 257/48 |
| 2008/0062808 A1 * | 3/2008 | Kawaguchi | ............... | G11C 5/02 365/230.06 |
| 2012/0146707 A1 * | 6/2012 | Riho | ........................ | G11C 5/02 327/419 |
| 2012/0195148 A1 * | 8/2012 | Yoko | ........................ | G11C 5/04 365/219 |
| 2013/0279283 A1 * | 10/2013 | Seo | .................. | G11C 11/40611 365/222 |
| 2014/0192583 A1 * | 7/2014 | Rajan | ........................ | G11C 7/10 365/63 |
| 2015/0089327 A1 * | 3/2015 | Youn | ..................... | G06F 11/167 714/768 |

FOREIGN PATENT DOCUMENTS

| | | |
|---|---|---|
| KR | 1020040078472 | 9/2004 |
| KR | 1020110111219 | 10/2011 |
| KR | 1020120074897 | 7/2012 |

* cited by examiner

*Primary Examiner* — Huan Hoang
*Assistant Examiner* — Pablo Huerta
(74) *Attorney, Agent, or Firm* — IP & T Group LLP

(57) ABSTRACT

A semiconductor integrated circuit includes a plurality of semiconductor chips. Each of the plurality of semiconductor chips includes a chip selection unit suitable for generating an internal chip selection signal in response to one or more selective chip selection signals and transferring the selective chip selection signals to an adjacent semiconductor chip of the plurality of semiconductor chips, a selective setting unit suitable for generating a selective internal signal, selectively activated in each semiconductor chip, in response to the internal chip selection signal and an external setting signal, and a common setting unit suitable for generating a common internal signal, activated in common in the plurality of semiconductor chips, in response to the setting signal and an external common chip selection signal.

18 Claims, 2 Drawing Sheets

SEMICONDUCTOR INTEGRATED CIRCUIT

CROSS-REFERENCE TO RELATED APPLICATIONS

The present application claims priority of Korean Patent Application No. 10-2013-0118596, filed on Oct. 4, 2013, which is incorporated herein by reference in its entirety.

BACKGROUND

1. Field

Exemplary embodiments of the present invention relate to semiconductor design technology, and more particularly, to a semiconductor integrated circuit including a plurality of semiconductor chips.

2. Description of the Related Art

In general, packaging technology for a semiconductor integrated circuit has been continuously developed for reduction in size and increase in mounting reliability. Various techniques for a stack package are being developed in line with a demand for smaller size and higher performance of electrical and electronic products.

A term 'stack' commonly referred in the semiconductor industry means that two or more semiconductor chips or packages are piled up. In accordance with such a stack package, for example, a semiconductor memory device may have a memory capacity twice or more compared to a memory capacity that may be implemented in a semiconductor integration process. Furthermore, researches and development for a stack package are being accelerated because the memory capacity, mounting density, and efficiency in the use of a mounting area may be increased by the stack package.

A stack package may be fabricated using a method of stacking selective semiconductor chips and packaging the stacked semiconductor chips at once or a method of stacking packaged selective semiconductor chips. The selective semiconductor chips of a stack package are electrically coupled through metal wires or chip through vias.

SUMMARY

Exemplary embodiments of the present invention are directed to a semiconductor integrated circuit in which a plurality of semiconductor chips is controlled in common and also controlled selectively.

In accordance with an exemplary embodiment of the present invention, a semiconductor integrated circuit includes a plurality of semiconductor chips. Each of the plurality of semiconductor chips may include a chip selection unit suitable for generating an internal chip selection signal in response to one or more selective chip selection signals, a selective setting unit suitable for generating a selective internal signal in response to the internal chip selection signal and a setting signal inputted from an outside of the semiconductor integrated circuit, and a common setting unit suitable for generating a common internal signal in response to the setting signal and a common chip selection signal inputted from the outside, wherein common internal signals are activated in common and selective internal signals are selectively activated in the semiconductor chips.

In accordance with another exemplary embodiment of the present invention, in a semiconductor integrated circuit in which a plurality of semiconductor chips are vertically stacked, each of the plurality of semiconductor chips includes a chip selection unit suitable for generating an internal chip selection signal in response to one or more selective chip selection signals and transferring the selective chip selection signals to an adjacent semiconductor chip of the plurality of semiconductor chips, a selective setting unit suitable for generating a selective internal signal in response to the internal chip selection signal and a setting signal inputted from an outside of the semiconductor integrated circuit, and a common setting unit suitable for generating a common internal signal in response to the setting signal and a common chip selection signal inputted from the outside.

In accordance with further exemplary embodiment of the present invention, a semiconductor system includes a controller suitable for generating a first chip selection signal and one or more second chip selection signals, and a plurality of semiconductor chips suitable for generating first internal signals, respectively, in common in response to the first chip selection signal and selectively generating second internal signals, respectively, in response to the second chip selection signals, wherein, among the semiconductor chips, an Nth semiconductor chip receives the second chip selection signals from an N−1th semiconductor chip and transfers the second chip selection signals to an N+1th semiconductor chip, wherein the N is a natural number.

DETAILED DESCRIPTION

Figure 1:
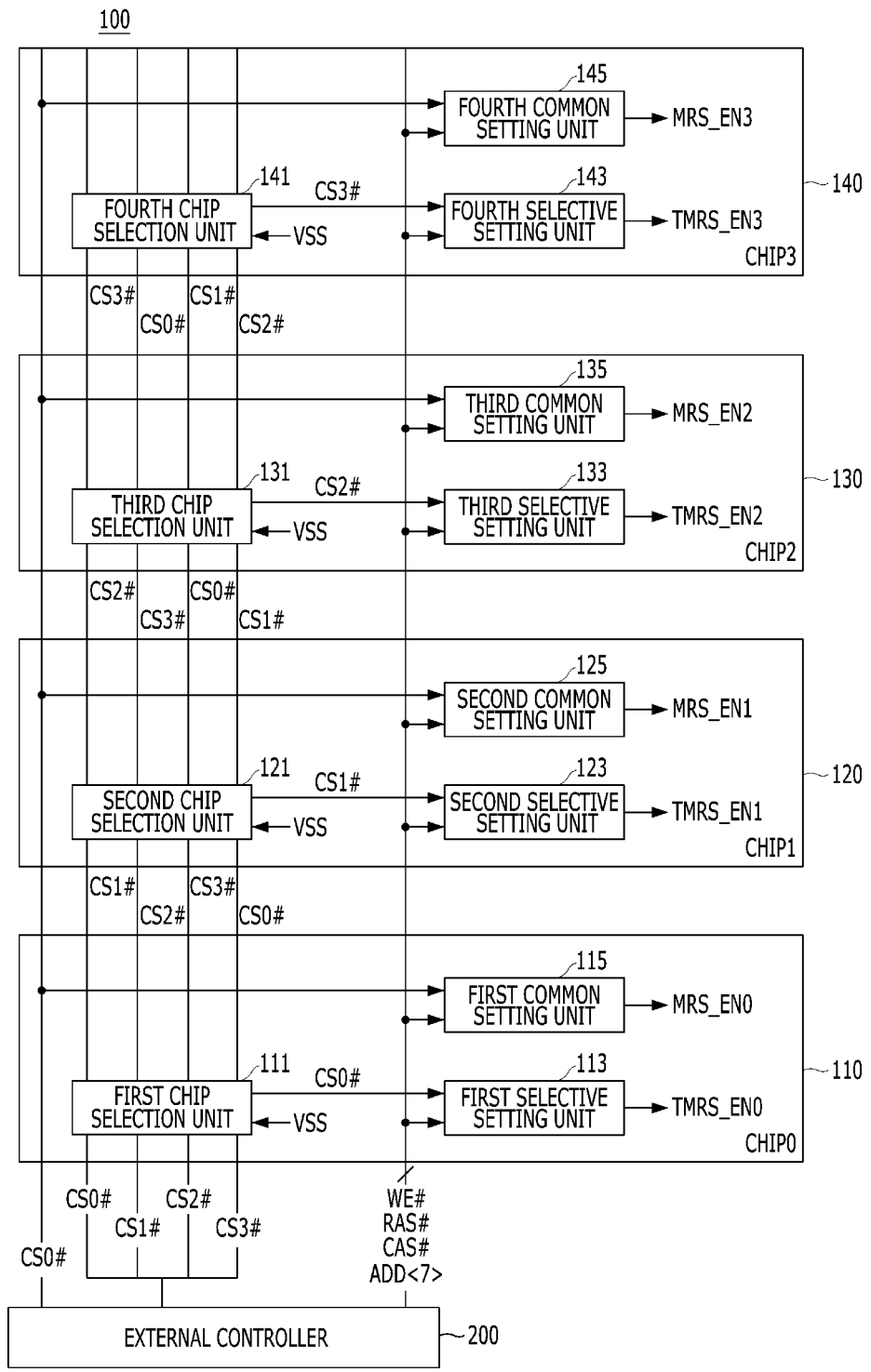
FIG. 1 is a block diagram illustrating a semiconductor integrated circuit in accordance with an embodiment of the present invention.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, reference numerals correspond directly to the like numbered parts in the various figures and embodiments of the present invention. It is also noted that in this specification, "connected/coupled" refers to one component not only directly coupling another component but also indirectly coupling another component through an intermediate component. In addition, a singular form may include a plural form as long as it is not specifically mentioned in a sentence.

In an embodiment of the present invention, a semiconductor integrated circuit in which, for example, four semiconductor chips are stacked is described below for illustrative purpose. More or less chips may be stacked in different embodiments.

Figure 2:
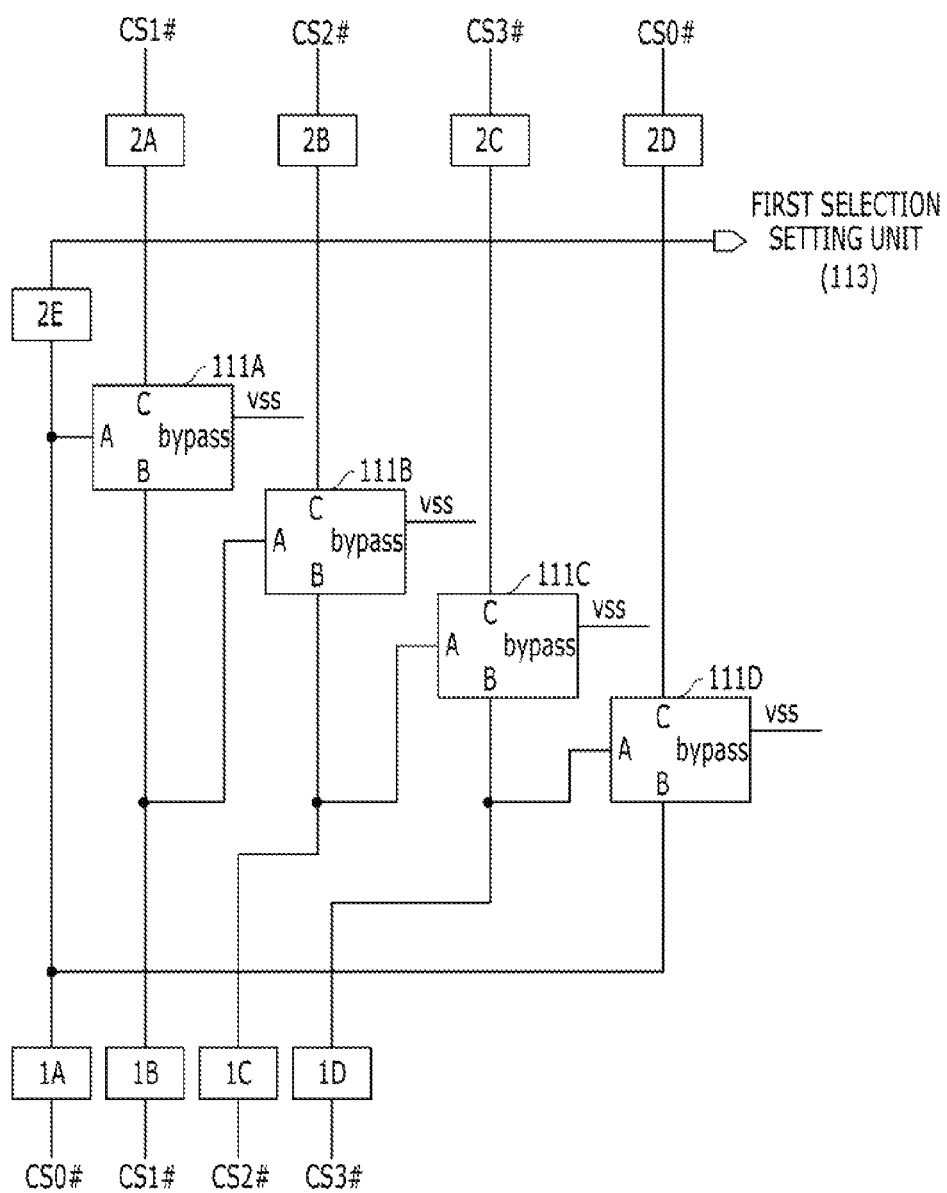
FIG. 2 shows an internal construction of a first chip selection unit shown in FIG. 1.

FIG. 1 is a block diagram of a semiconductor integrated circuit in accordance with an embodiment of the present invention, and FIG. 2 shows an internal construction of a first chip selection unit shown in FIG. 1.

Referring to FIG. 1, the semiconductor integrated circuit 100 includes first to fourth semiconductor chips 110, 120, 130, and 140 which are vertically stacked. The first to the fourth semiconductor chips 110, 120, 130, and 140 may be homogeneous or heterogeneous chips, and the first to the fourth semiconductor chips 110, 120, 130, and 140 are hereinafter described as homogeneous chips, for simple description.

The first to the fourth semiconductor chips 110, 120, 130, and 140 are controlled in common in response to a common chip selection signal CS0# and are selected and controlled selectively in response to first to fourth selective chip selection signals CS0#, CS1#, CS2#, and CS3#. The common chip selection signal CS0# is separated from the first to the fourth selective chip selection signals CS0#, CS1#, CS2#, and CS3# and is separately received, but any one of the first to the fourth selective chip selection signals CS0#, CS1#, CS2#, and CS3# may be used. For example, the first selective chip selection signal CS0# may be used as the common chip selection signal CS0#. The first semiconductor chip 110 may be coupled with an external controller 200 because the first to the fourth semiconductor chips 110, 120, 130, and 140 are vertically stacked. In such a case, the first semiconductor chip 110 receives the common chip selection signal CS0# and the first to the fourth selective chip selection signals CS0#, CS1#, CS2#, and CS3# and transfers them to the second to the fourth semiconductor chips 120, 130, and 140. In other words, the first semiconductor chip 110 transfers the common chip selection signal CS0# and the first to the fourth selective chip selection signals CS0#, CS1#, CS2#, and CS3#, received from the external controller 200, to the second semiconductor chip 120. The second semiconductor chip 120 transfers the common chip selection signal CS0# and the first to the fourth selective chip selection signals CS0#, CS1#, CS2#, and CS3#, received from the first semiconductor chip 110, to the third semiconductor chip 130. The third semiconductor chip 130 transfers the common chip selection signal CS0# and the first to the fourth selective chip selection signals CS0#, CS1#, CS2#, and CS3#, received from the second semiconductor chip 120, to the fourth semiconductor chip 140. Setting signals WE#, RAS#, CAS#, and ADD<7> to be described later are also transferred from the external controller 200 to the second to the fourth semiconductor chips 120, 130, and 140 through the first semiconductor chip 110. The first to the fourth semiconductor chips 110, 120, 130, and 140 are described in more detail below. Here, only the first semiconductor chip 110 is described representatively because the first to the fourth semiconductor chips 110, 120, 130, and 140 are homogeneous chips.

The first semiconductor chip 110 may include a first chip selection unit 111, a first selective setting unit 113, and a first common setting unit 115. The first chip selection unit 111 is configured to generate a first internal chip selection signal CS0# in response to the first to the fourth selective chip selection signals CS0#, CS1#, CS2#, and CS3# externally received and transfer the first to the fourth selective chip selection signals CS0#, CS1#, CS2#, and CS3# to the second semiconductor chip 120 in response to a control signal VSS. The first selective setting unit 113 is configured to generate a first selective internal signal TMRS_EN0 that is individually activated in the corresponding semiconductor chip in response to the first internal chip selection signal CS0# and the setting signals WE#, RAS#, CAS#, and ADD<7> received from the external controller 200. The first common setting unit 115 is configured to generate a first common internal signal MRS_EN0 that is activated in common in the first to the fourth semiconductor chips 110, 120, 130, and 140 in response to the setting signals WE#, RAS#, CAS#, and ADD<7> and the common chip selection signal CS0#.

As shown in FIG. 2, the first chip selection unit 111 includes first to fourth input terminals 1A to 1D, first to fourth transfer units 111A, 111B, 111C, and 111D, and first to fifth output terminals 2A to 2E. The first to fourth input terminals 1A to 1D are configured to receive the first to the fourth selective chip selection signals CS0#, CS1#, CS2#, and CS3#. The first to fourth transfer units 111A, 111B, 111C, and 111D are configured to shift the first to the fourth selective chip selection signals CS0#, CS1#, CS2#, and CS3#, received through the first to the fourth input terminals 1A to 1D by one stage in response to the control signal VSS and to transfer the shifted selective chip selection signals. The first to fourth output terminals 2A to 2D are configured to output first to fourth shifted selective chip selection signals CS1#, CS2#, CS3#, and CS0#, shifted by the first to the fourth transfer units 111A, 111B, 111C, and 111D, to the second semiconductor chip 120. The fifth output terminal 2E is directly coupled with the first input terminal 1A and configured to output the first selective chip selection signal CS0# to the first selective setting unit 113 as the first internal chip selection signal. The transfer units 111A, 111B, 111C, and 111D may include first to fourth multiplexing units (not shown), respectively. The first to the fourth multiplexing units receive respective pairs of continuous selective chip selection signals (CS0#, CS1#), (CS1#, CS2#), (CS2#, CS3#), and (CS3#, CS0#) of the first to the fourth selective chip selection signals CS0#, CS1#, CS2#, and CS3#. The first to the fourth multiplexing units selects any one of the received pair in response to the control signal VSS. For example, the first multiplexing unit of the first transfer unit 111A may select the second selective chip selection signal CS1# from the first and the second selective chip selection signals CS0# and CS1# in response to the control signal VSS and transfer the selected second selective chip selection signal CS1# to the first output terminal 2A. The second multiplexing unit of the second transfer unit 111B may select the third selective chip selection signal CS2# from the second and the third selective chip selection signals CS1# and CS2# in response to the control signal VSS and transfer the selected third selective chip selection signal CS2# to the second output terminal 2B. The third multiplexing unit of the third the transfer unit 111C may select the fourth selective chip selection signal CS3# from the third and the fourth selective chip selection signals CS2# and CS3# in response to the control signal VSS and transfer the selected fourth selective chip selection signal CS3# to the third output terminal 2C. The fourth multiplexing unit of the fourth transfer unit 111D may select the first selective chip selection signal CS0# from the fourth and the first selective chip selection signals CS3# and CS0# in response to the control signal VSS and transfer the selected first selective chip selection signal CS0# to the fourth output terminal 2D.

Referring back to FIG. 1, the first selective setting unit 113 determines whether or not to activate the first selective internal signal TMRS_EN0 in response to the first internal chip selection signal CS0# and the setting signals WE#, RAS#, CAS#, and ADD<7>. For example, since the setting signals WE#, RAS#, CAS#, and ADD<7> include external commands WE#, RAS#, and CAS# and an external address ADD<7>, whether the first selective setting unit 113 is enabled or not may be determined in response to the external address ADD<7>, and the first selective setting unit 113 may determine whether or not to activate the first selective internal signal TMRS_EN0 based on a combination of the first selective chip selection signal CS0#0 and the external commands WE#, RAS#, and CAS#. For example, the first selective setting unit 113 may include a test mode register set (TMRS) control unit (not shown) for controlling whether or not to enable a TMRS and a command decoder (not shown) for generating various internal commands.

Furthermore, the first common setting unit 115 determines whether or not to activate the first common internal signal MRS_EN0 in response to the common chip selection signal CS0# and the setting signals WE#, RAS#, CAS#, and ADD<7>. For example, whether the first common setting unit 115 is enabled or not may be determined in response to the external address ADD<7>, and the first common setting unit 115 may determine whether or not to activate the first common internal signal MRS_EN0 based on a combination of the common chip selection signal CS0# and the external commands WE#, RAS#, and CAS#. For example, the first common setting unit 115 may include a mode register set (MRS) control unit (not shown) for controlling whether or not to enable an (MRS).

The operation of the semiconductor integrated circuit 100 configured as described above in accordance with an embodiment of the present invention is described below.

An operation in which the first to the fourth semiconductor chips 110, 120, 130, and 140 are controlled in common is described below.

When the external address ADD<7> having a first logic level is received, the first to the fourth common setting units 115, 125, 135, and 145 are enabled and the first to the fourth selective setting units 113, 123, 133, and 143 are disabled.

In such a state, when the common chip selection signal CS0# is activated, the first to the fourth common setting units 115, 125, 135, and 145 activate the first to the fourth common internal signals MRS_EN0, MRS_EN1, MRS_EN2, and MRS_EN3 in common based on a combination of the common chip selection signal CS0# and the external commands WE#, RAS#, and CAS#.

When the first to the fourth common internal signals MRS_EN0, MRS_EN1, MRS_EN2, and MRS_EN3 are activated in common, first to fourth internal circuits (not shown) included in the first to the fourth semiconductor chips 110, 120, 130, and 140 perform respective predetermined operations. For example, first to the fourth MRSs are enabled in response to the first to the fourth common internal signals MRS_EN0, MRS_EN1, MRS_EN2, and MRS_EN3, thus performing MRS setting operations.

An operation in which the first to the fourth semiconductor chips 110, 120, 130, and 140 are selectively controlled is described below.

When the external address ADD<7> having a second logic level is received, the first to the fourth common setting units 115, 125, 135, and 145 are disabled, and the first to the fourth selective setting units 113, 123, 133, and 143 are enabled. Furthermore, the first to the fourth chip selection units 111, 121, 131, and 141 selects one selective chip selection signal allocated thereto, from the first to the fourth selective chip selection signals CS0#, CS1#, CS2#, and CS3#, in response to the control signal VSS and provides the first to the fourth selective setting units 113, 123, 133, and 143, respectively. For example, the first chip selection unit 111 may select the first selective chip selection signal CS0# from the first to the fourth selective chip selection signals CS0#, CS1#, CS2#, and CS3# and provide the selected first selective chip selection signal CS0# to the first selective setting unit 113. The second chip selection unit 121 may select the second selective chip selection signal CS1# from the first to the fourth selective chip selection signals CS0#, CS1#, CS2#, and CS3# and provide the selected second selective chip selection signal CS1# to the second selective setting unit 123. The third chip selection unit 131 may select the third selective chip selection signal CS2# from the first to the fourth selective chip selection signals CS0#, CS1#, CS2#, and CS3# and provide the selected third selective chip selection signal CS2# to the third selective setting unit 133. The fourth chip selection unit 141 may select the fourth selective chip selection signal CS3# from the first to the fourth selective chip selection signals CS0#, CS1#, CS2#, and CS3# and provide the selected fourth selective chip selection signal CS3# to the fourth selective setting unit 143.

In such a state, the first to the fourth selective setting units 113, 123, 133, and 143 individually activate the first to the fourth selective internal signals TMRS_EN0, TMRS_EN1, TMRS_EN2, and TMRS_EN3, respectively, based on combinations of the first to the fourth selective chip selection signals CS0#, CS1#, CS2#, and CS3# and the external commands WE#, RAS#, and CAS#. For example, when the first selective chip selection signal CS0# of the first to the fourth selective chip selection signals CS0#, CS1#, CS2#, and CS3# is activated, only the first selective setting unit 113 activates the first selective internal signal TMRS_EN0 based on a combination of the first selective chip selection signal CS0# and the external commands WE#, RAS#, and CAS#.

When at least one of the first to the fourth selective internal signals TMRS_EN0, TMRS_EN1, TMRS_EN2, and TMRS_EN3 is activated, at least one of fifth to eighth internal circuits (not shown) of the first to the fourth semiconductor chips 110, 120, 130, and 140 performs a predetermined operation. For example, when only the first selective internal signal TMRS_EN0 is activated, only the first TMRS (corresponding to the fifth internal circuit) is enabled, thus performing a TMRS setting operation.

In accordance with an embodiment of the present invention, a circuit to be controlled in common and a circuit to be controlled selectively within each semiconductor chip may be easily controlled because the circuits are separately controlled.

In an embodiment of the present invention, the semiconductor integrated circuit having a stack package structure has been illustrated as an example, but the present invention is not limited thereto. For example, the present invention may be applied to a semiconductor integrated circuit in which a plurality of semiconductor chips are arrayed in parallel on one surface of a package substrate and a semiconductor integrated circuit in which a plurality of semiconductor chips are arrayed in parallel on both surfaces of a package substrate.

A circuit to be controlled in common and a circuit to be controlled selectively, from among circuits included in a plurality of semiconductor chips, are classified, and the enable signals of the classified circuits are separated. Accordingly, the plurality of semiconductor chips in package may be easily controlled.

While the present invention has been described with respect to the specific embodiments, it will be apparent to those skilled in the art that various changes and modifications may be made without departing from the spirit and scope of the invention as defined in the following claims.

What is claimed is:

1. A semiconductor integrated circuit comprising a plurality of semiconductor chips, wherein each of the plurality of semiconductor chips comprises:
   a chip selection unit suitable for generating an internal chip selection signal in response to one or more selective chip selection signals;
   a selective setting unit suitable for generating a selective internal signal in response to the internal chip selection signal and a setting signal inputted from an outside of the semiconductor integrated circuit; and
   a common setting unit suitable for generating a common internal signal in response to the setting signal and a common chip selection signal inputted from the outside,
   wherein the common internal signals are activated in common and selective internal signals are selectively activated in the semiconductor chips.

2. The semiconductor integrated circuit of claim 1, wherein:
the selective chip selection signals comprise a plurality of selective chip selection signals corresponding to the respective semiconductor chips; and
the chip selection unit selects one of the plurality of selective chip selection signals as the internal chip selection signal in response to a control signal.

3. The semiconductor integrated circuit of claim 2, wherein the common chip selection signal includes one of the plurality of selective chip selection signals.

4. The semiconductor integrated circuit of claim 1, wherein the selective setting unit comprises a test mode register set (TMRS) control unit for controlling whether or not to enable a TMRS.

5. The semiconductor integrated circuit of claim 1, wherein the selective setting unit comprises a command decoder for generating internal commands.

6. The semiconductor integrated circuit of claim 1, wherein the common setting unit comprises a mode register set (MRS) control unit for controlling whether or not to enable an MRS.

7. The semiconductor integrated circuit of claim 1, wherein the chip selection unit shifts the selective chip selection signals and transfers shifted selective chip selection signals to a next semiconductor chip of the plurality of semiconductor chips.

8. A semiconductor integrated circuit in which a plurality of semiconductor chips are stacked, wherein each of the plurality of semiconductor chips comprises:
a chip selection unit suitable for generating an internal chip selection signal in response to one or more selective chip selection signals and transferring the selective chip selection signals to an adjacent semiconductor chip of the plurality of semiconductor chips;
a selective setting unit suitable for generating a selective internal signal in response to the internal chip selection signal and a setting signal inputted from an outside of the semiconductor integrated circuit; and
a common setting unit suitable for generating a common internal signal in response to the setting signal and a common chip selection signal inputted from the outside.

9. The semiconductor integrated circuit of claim 8, wherein:
the selective chip selection signals comprise a plurality of selective chip selection signals corresponding to the respective semiconductor chips; and
the chip selection unit outputs a first selective chip selection signal received through a set input terminal, from among the plurality of selective chip selection signals, as the internal chip selection signal.

10. The semiconductor integrated circuit of claim 9, wherein the chip selection unit comprises:
a plurality of input terminals suitable for receiving the plurality of selective chip selection signals;
a transfer unit suitable for transferring the plurality of selective chip selection signals, received through the plurality of input terminals, as a plurality of shifted selective chip selection signals by shifting an Nth selective chip selection signal to an N+1th selective chip selection signal, among the plurality of selective chip selection signals, wherein the N is a natural number;
a plurality of first output terminals suitable for outputting the plurality of shifted selective chip selection signals to the adjacent semiconductor chip; and
an second output terminal directly coupled with the set input terminal and suitable for outputting the first selective chip selection signal as the internal chip selection signal.

11. The semiconductor integrated circuit of claim 10, wherein the transfer unit comprises:
a plurality of multiplexing units, each suitable for receiving a pair of continuous selective chip selection signals of the plurality of selective chip selection signals and outputting one of the pair of continuous selective chip selection signals in response to the control signal.

12. The semiconductor integrated circuit of claim 9, wherein the common chip selection signal includes one of the plurality of selective chip selection signals.

13. The semiconductor integrated circuit of claim 8, wherein the selective setting unit comprises a test mode register set (TMRS) control unit for controlling whether or not to enable a TMRS.

14. The semiconductor integrated circuit of claim 8, wherein the selective setting unit comprises a command decoder for generating internal commands.

15. The semiconductor integrated circuit of claim 8, wherein the common setting unit comprises a mode register set (MRS) control unit for controlling whether or not to enable an MRS.

16. The semiconductor integrated circuit of claim 8, wherein common internal signals are activated in common and selective internal signals are selectively activated in the semiconductor chips.

17. A semiconductor system comprising:
a controller suitable for generating a first chip selection signal and one or more second chip selection signals; and
a plurality of semiconductor chips suitable for generating first internal signals, respectively, in common in response to the first chip selection signal, and selectively generating second internal signals, respectively, in response to the second chip selection signals,
wherein, among the semiconductor chips, an Nth semiconductor chip receives the second chip selection signals from an N−1th semiconductor chip and transfers the second chip selection signals to an N+1th semiconductor chip, wherein the N is a natural number,
wherein the second chip selection signals correspond to the semiconductor chips, and each of the semiconductor chips generates the second internal signal in response to a correspond signal of the second chip selection signals,
wherein the Nth semiconductor chip shifts the second chip selection signals received from the N−1th semiconductor chip and transfers shifted chip selection signals as the second chip selection signals to the N+1th semiconductor chip.

18. The semiconductor integrated circuit of claim 17, each of the semiconductor chips comprises:
a chip selection unit suitable for generating an internal chip selection signal in response to the second chip selection signals and shifting the second chip selection signals;
a selective setting unit suitable for generating the second internal signal in response to the internal chip selection signal; and
a common setting unit suitable for generating the first internal signal in response to the first chip selection signal.

* * * * *